(12) United States Patent
Miller et al.

(10) Patent No.: US 7,352,311 B2
(45) Date of Patent: Apr. 1, 2008

(54) CONTINUOUS TIME NOISE SHAPING ANALOG-TO-DIGITAL CONVERTER

(75) Inventors: Matthew R. Miller, Arlington Heights, IL (US); Pallab Midya, Palatine, IL (US); Poojan A. Wagh, Sleepy Hollow, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/507,919

(22) Filed: Aug. 22, 2006

(65) Prior Publication Data

US 2008/0048898 A1    Feb. 28, 2008

(51) Int. Cl.
*H03M 3/00*    (2006.01)

(52) U.S. Cl. .................................... 341/143; 341/159

(58) Field of Classification Search ................ 341/143, 341/155–172
See application file for complete search history.

(56) References Cited

U.S. PATENT DOCUMENTS

| | | | |
|---|---|---|---|
| 5,528,239 A * | 6/1996 | Swanson et al. ............ 341/143 |
| 5,548,286 A | 8/1996 | Craven | |
| 6,172,630 B1 * | 1/2001 | Nelson ........................ 341/143 |
| 6,232,899 B1 * | 5/2001 | Craven ........................ 341/126 |
| 6,271,782 B1 * | 8/2001 | Steensgaard-Madsen .... 341/143 |
| 6,344,811 B1 * | 2/2002 | Melanson .................... 341/143 |
| 6,414,614 B1 * | 7/2002 | Melanson .................... 341/143 |
| 6,437,719 B1 * | 8/2002 | Noro et al. .................. 341/143 |
| 6,480,129 B1 * | 11/2002 | Melanson .................... 341/143 |
| 6,664,908 B2 * | 12/2003 | Sundquist et al. .......... 341/143 |
| 6,768,435 B2 | 7/2004 | Xu | |
| 6,965,339 B2 * | 11/2005 | Midya et al. ................ 341/163 |
| 7,078,964 B2 * | 7/2006 | Risbo et al. .................. 330/10 |
| 7,084,799 B1 * | 8/2006 | Butler ......................... 341/143 |
| 7,084,800 B2 * | 8/2006 | Miller ......................... 341/144 |
| 2006/0044057 A1 * | 3/2006 | Hezar et al. ................... 330/10 |
| 2006/0072657 A1 * | 4/2006 | Putzeys ...................... 375/238 |
| 2007/0085717 A1 * | 4/2007 | Pedersen et al. ............ 341/143 |

OTHER PUBLICATIONS

Omid Shoaei' and W. Martin Snelgrove, A Wide-Range Tunable 25MHz-110MHz BiCMOS Continuous-Time Filter, Proc. ISCAS-96, Atlanta, May 12-15, 1996.

* cited by examiner

*Primary Examiner*—Linh Nguyen
(74) *Attorney, Agent, or Firm*—Brinks Hofer Gilson & Lione

(57) ABSTRACT

A system for a continuous time noise shaping analog-to-digital converter ("ADC") with a suppressed carrier pulse width modulated ("PWM") quantizer is disclosed. In particular, a suppressed carrier feedback signal may expand the dynamic range of a sigma delta modulated ADC and enhance the stability of the noise shaping loop.

20 Claims, 3 Drawing Sheets

CONTINUOUS TIME NOISE SHAPING ANALOG-TO-DIGITAL CONVERTER

BACKGROUND

The present disclosure relates to an analog-to-digital converter ("ADC"). More specifically, the disclosure relates to an ADC using a suppressed carrier pulse width modulated ("PWM") or other feedback signal.

Analog-to-digital conversion is a process of converting continuous or analog signals into discrete digital signals without losing the essential content of the original signal. One example of an ADC is a sigma delta ADC, which may be used in handheld radio transceivers such as cell phones. Sigma delta ADCs allow for a high resolution conversion, however, they may suffer from various drawbacks. For example, although sigma delta ADCs allow for high resolutions, they may be slow because of the need to oversample the input signal. The oversampling ratio directly impacts the resolution of a sigma delta ADC. Further, the dynamic range of a continuous time sigma delta ADC may be limited for a given power supply voltage and power consumption budget. In a sigma delta ADC, the feedback signal may have high power at high frequencies and the performance of the ADC may be limited based on the need to accommodate this power. This may be true even with small input signals into the ADC input.

In addition, continuous time sigma delta ADCs may require a high sampling frequency, which results in increased power dissipation. Likewise, continuous time noise shaping ADCs may be limited by aperture error or sampling clock jitter. The sampling clock jitter results in uncertainty in the actual sampling time. The error may be relatively small at low frequencies, but may be significant at higher frequencies. The jitter also affects the quality of the feedback signal in a noise shaping loop and may cause disagreement between the feedback signal and the corresponding digital output of the ADC resulting in distortion or degradation of the signal-to-noise ratio.

Further, quantization noise may result from the process of reducing the continuous analog signal to a discrete digital signal. The sampling that occurs in reducing the analog signal to the digital signal inherently is not an exact replication of the original signal, and the difference between the signals is the quantization error. Each sample of the digital signal is an estimate of the analog signal at a certain point in time, and the difference between the signals is the quantization noise. The quantization error is caused by the finite resolution of the ADC. There may be additional noise that is produced by the ADC, but the quantization noise may be and is often the biggest component.

Accordingly, it is desirable to produce ADCs with increased dynamic range that minimize the distortion of the signal and the quantization noise during the conversion. Increased dynamic range of a continuous-time sigma delta ADC may allow for increased performance and decreased costs for a given power supply voltage and power consumption budget.

BRIEF DESCRIPTION OF THE DRAWINGS

The components and the figures are not necessarily to scale, emphasis instead being placed upon illustrating the principles of the invention.

DETAILED DESCRIPTION OF THE DRAWINGS AND THE PRESENTLY PREFERRED EMBODIMENTS

The embodiments described below include a system and method for a continuous time noise shaping analog-to-digital converter ("ADC") with a suppressed carrier pulse width modulated ("PWM") quantizer. In particular, a suppressed carrier feedback signal may expand the dynamic range of an ADC and enhance the stability of the noise shaping loop. In one embodiment, the suppressed carrier feedback signal may produce on the order of 6 decibel ("dB") more power than a conventional PWM feedback signal. The suppressed carrier PWM signal may be utilized into a noise shaping oversampling ADC or a sigma delta ADC. Other feedback signals with or without PWM may be used.

Figure 1:
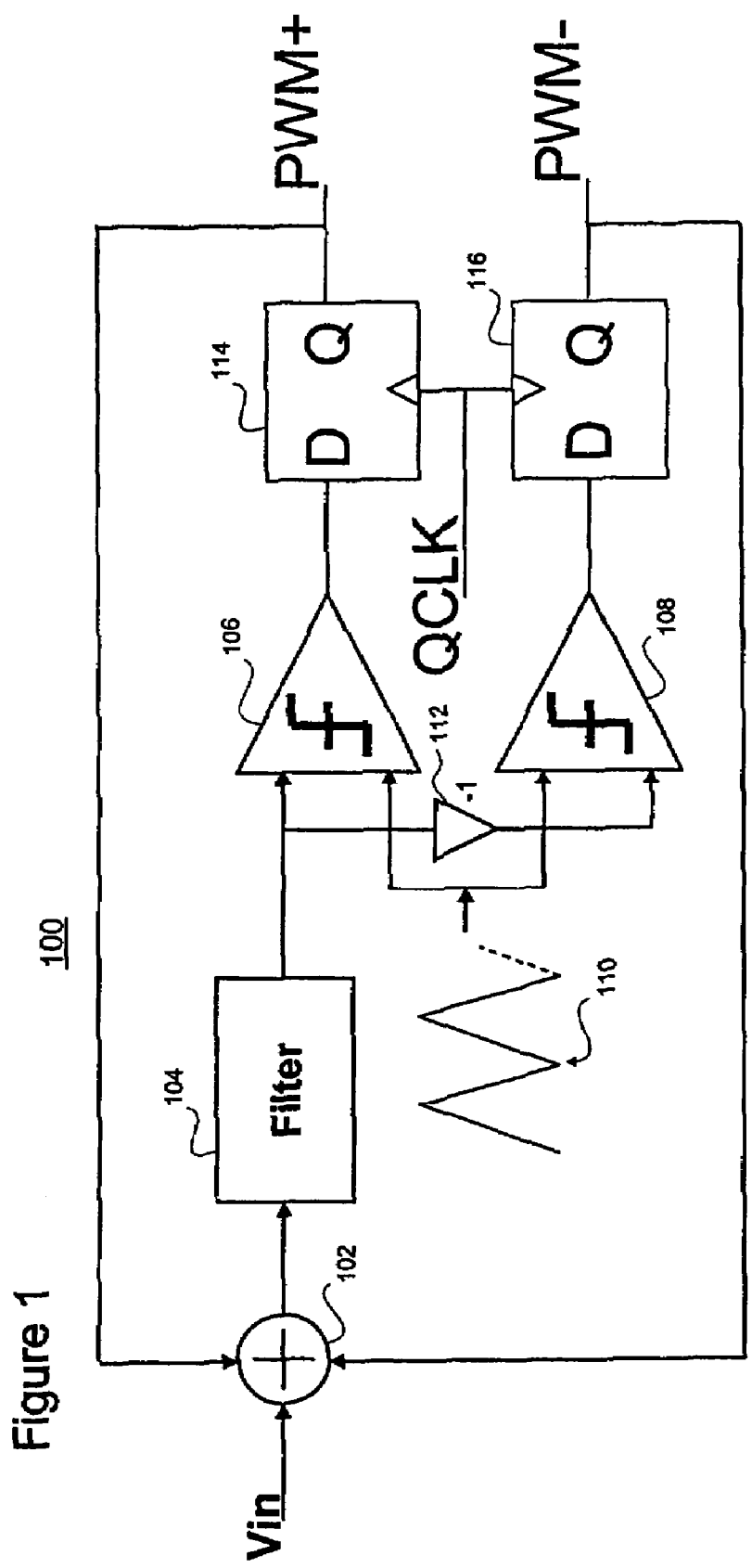
FIG. 1 illustrates one embodiment of an analog-to-digital converter.

FIG. 1 illustrates one embodiment of an analog to digital converter ("ADC"). More specifically, modulator 100 is a continuous time noise shaping ADC with a suppressed carrier pulse width modulated feedback signal. In one embodiment, and as will be described below, the modulator 100 may involve sigma delta modulation.

As described, pulse width modulation ("PWM") involves modulating the duty ratio or pulse width of a rectangular or other waveform. Alternatively, PWM may be referred to as pulse edge modulation. Sigma-delta modulation produces an output signal that is subtracted from an input signal to form an error signal. The error signal is integrated such that if the integral exceeds a predetermined limit, the output changes state.

As an overview of FIG. 1, the modulator 100 includes an input voltage Vin applied to a summer 102. The output of the summer 102 is input into filter 104. The filter output is transmitted to a quantizer 106 and after proceeding through an inverter 112, the inverted filter output is passed to a quantizer 108. Both the quantizer 106 and the quantizer 108 receive a ramp signal or other wave 110 as an additional input. Alternatively, the filter output may be fed directly to the quantizers 106, 108 while the ramp signal is passed through the inverter before being applied to the quantizer 108. The outputs of the quantizer 106 and the quantizer 108 are fed to a flip-flop 114 and a flip-flop 116, respectively. Both the flip-flop 114 and the flip-flop 116 further receive a quantization clock QCLK input. The flip-flop 114 outputs a pulse width modulated ("PWM") PWM+ signal, and the flip-flop 116 outputs a pulse width modulated PWM− signal.

As a result of the inversion of the signal applied to the quantizer 108, the PWM+ and PWM− signals may have a special relationship. As discussed above, the PWM signal has two defined output levels, a positive value and a negative value. The duty ratio is a parameter that describes the proportion of time that the PWM signal is at its positive value. The nominal duty ratio of the PWM signals may be 50%. In general, the PWM+ and PWM− signals will have complementary duty ratios. In other words, if the PWM+ signal has a duty ratio of 65% over the current switching cycle, then the PWM− signal may have a duty ratio that is close to or identically equal to 1-0.65 or 35%. There may be short term deviations from this relationship from time to time depending on the amplitude and frequency content of the signal applied to the ADC, but this relationship may hold on the average over time. In addition, the PWM+ and PWM− signals possess a defined timing relationship because of the fact that the two quantizers 106, 108 share a common ramp signal. This timing relationship is most easily understood by considering the case when the duty ratio of PWM+ and PWM− are both 50%. In this case, the PWM+ and PWM− signals will have substantially equal amplitude values and substantially the same phase.

Both the PWM+ and PWM− signals are fed back into the summer 102 and combined with the input voltage Vin. At the summer 102, the PWM+ signal is subtracted from the input signal while the PWM− signal is added to the input signal to produce the summer 102 output. Accordingly, negative feedback of the loop is preserved for both quantizer paths.

The input may be an analog voltage Vin which is converted to a digital signal with an analog-to-digital converter ("ADC"). In alternate embodiments, the analog signal may be representative of a current or other value. The ADC receives an analog signal and generates a digital representation of that analog signal. The conversion to a digital signal involves sampling the analog input signal at time instances to obtain a sample value at each sampling instance. The frequency that the sample values are obtained may be referred to as the sampling frequency. The sample values are digitized by mapping them to a set of discrete levels. The number of discrete levels determines the resolution of the ADC. In one embodiment, the ADC as discussed herein may sample with 6 to 24 bits of resolution. In alternative embodiments, the resolution may be larger or smaller.

The summer 102 receives the input signal Vin. The input signal may be representative of a voltage, current, or other value. The output of the summer 102 is an addition of all the inputs into the summer 102. As shown, the summer 102 also receives two feedback signals PWM+ and PWM− as discussed below. PWM+ is a negative feedback input, so it is subtracted from Vin, and the positive feedback input PWM− is added. The resulting value from the summer 102 is passed to the noise shaping filter 104. In practice, the summer 102 may be implemented with either active or passive circuitry or a combination of the two. For example, the summer 102 may be built using separate resistive inputs into an opamp based summing amplifier.

In one embodiment, the noise-shaping filter 104 filters off unwanted quantization noise signal and increases the resolution of the output. One type of sigma delta modulator may reduce the noise at low frequencies, but the noise is increased at higher frequencies, where the noise may be filtered out by subsequent digital filtering. The action of spectrally steering the quantization noise to higher frequencies may be referred to as noise shaping. Accordingly, as the noise-shaping filter 104 order is increased, the quantization noise within the bandwidth of interest may be suppressed. Alternatively, the output from the noise shaping filter 104 may be continuous or discrete. In one embodiment, a switch capacitor circuit may use a discrete noise shaping filter.

Figure 2:
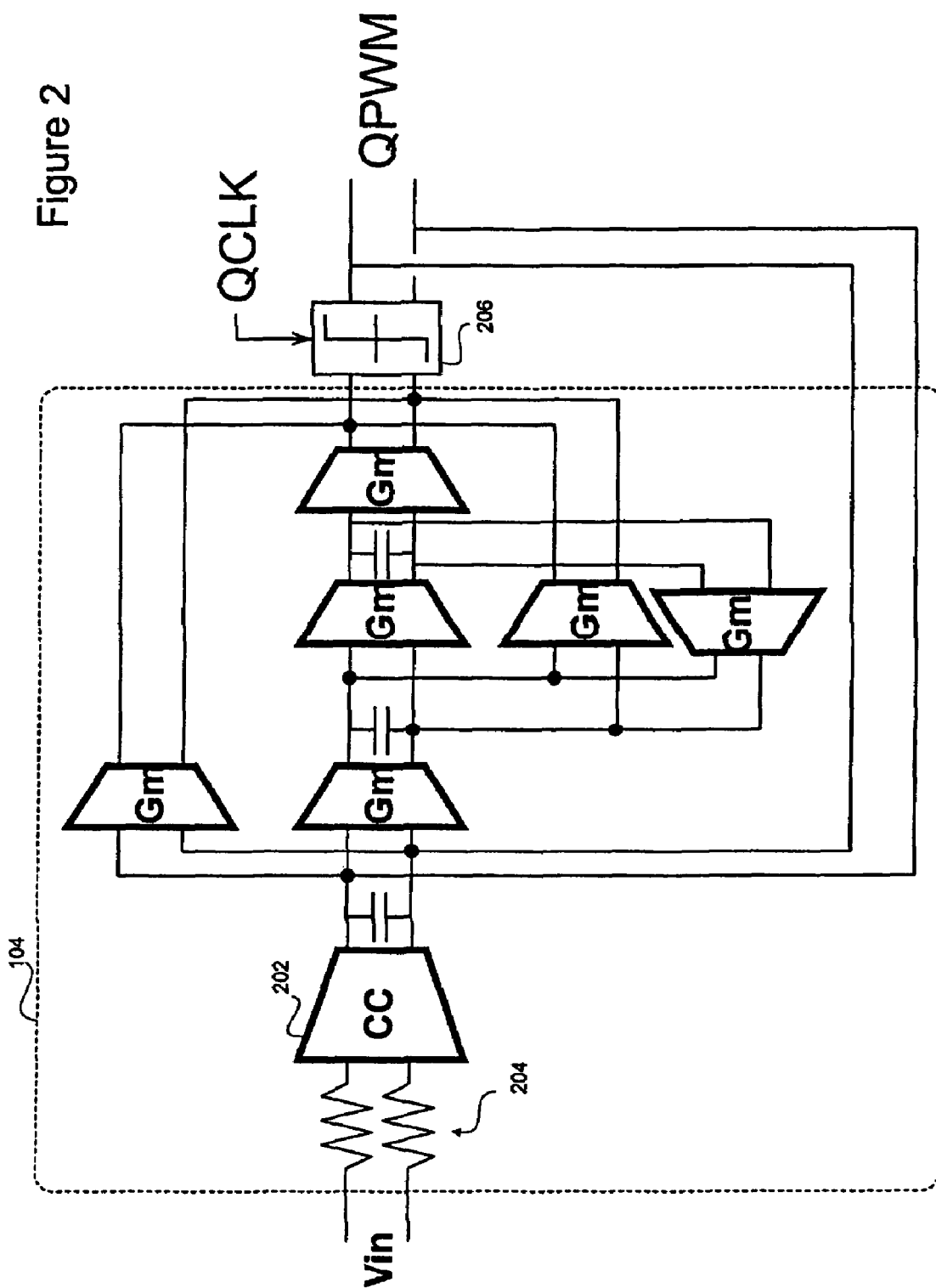
FIG. 2 illustrates a block diagram of one embodiment of a circuit design of an ADC.

In one embodiment, the noise-shaping filter 104 may be a third order transconductor-capacitor ("Gm-C") filter as shown in part of FIG. 2. In alternate embodiments, the noise-shaping filter 104 may be of a different order or a different type. The noise-shaping filter 104 may include a set of integrators. FIG. 2 illustrates a block diagram of one embodiment of a circuit design. For the sake of simplicity of the diagram, the two quantizers 106, 108 are represented by one block 206, and the two feedback signals are represented by a single pair of lines emerging from the quantizer block 206. In one embodiment, FIG. 2 may illustrate the noise-shaping filter 104 and may be a third order filter including at least one integrator implemented as a transconductor-capacitor pair ("Gm-C"). In one embodiment, the arrangement of Gm-C blocks may include three such Gm-C integrators each coupled to a transconductor Gm. The three transconductors are then connected to a common bus whereby the current mode output signals of the transconductors are summed to produce the composite filter output. Further, the embodiment may include one or more transconductors that accept as input the output signal of one Gm-C integrator and produce an output signal that is coupled to the output of the preceding integrator—thus creating a resonant response in the filter, which in turn creates a transmission zero in the noise transfer function of the ADC.

As shown, a current conveyer 202 receives the input signal Vin. The current conveyer 202 may provide a virtual ground at resistors 204. The output from the current conveyer 202 is passed to at least one of the Gm-C integrators. Additional Gm-C integrators may receive and output signals. It should be understood, that one embodiment is shown in FIG. 2, and alternative embodiments may also be available, including but not limited to a different arrangement of the integrators, transconductors, capacitors, and other passive or active components. The output from the noise-shaping filter 104 may be input into a quantizer 206. The quantizer 206 may be an embodiment of one of the quantizers 106, 108 as shown in FIG. 1 and further discussed below. The quantizer 206 may also receive a quantization clock QCLK input and outputs the QPWM signal as discussed below.

Referring back to FIG. 1, the modulator 100 may be implemented with a continuous-time filter. In an alternate embodiment, the modulator may utilize a discrete time filter. The continuous time and discrete time nomenclature refers to the basic topology of the noise-shaping filter 104. For continuous-time modulators, the modulator may include a continuous noise-shaping filter 104 that receives continuous data. The filter may be implemented with resistors, capacitors and amplifiers (not shown). In the alternative embodiment with discrete time processing, the input data may be sampled over time and include discrete sampled values. Further, the noise-shaping filter 104 may be implemented as a switch capacitor circuit (not shown). Discrete time modulators may have a clock input at an earlier point in the circuit, whereas as shown in FIG. 1, the clock signal QCLK appears at the flip-flops 114, 116 as discussed below.

The output from the noise-shaping filter 104 may then be input into a quantizer 106 and a quantizer 108. The quantizers 106, 108 may be referred to as comparators in some embodiments. A second input into each quantizer 106, 108 is a ramp or other wave 110 as discussed below. The two inputs into each of the quantizers 106, 108 are combined. The combined value is then compared to a reference value. If the combined value is greater than the reference, the output of the quantizer may be defined as 1. If the combined value is less than the reference, then the output of the quantizer may be defined a −1.

For the quantizer 106, the first input is received directly from the noise-shaping filter 104 and the second input is from the ramp wave 110 as discussed below. Conversely, the first input into the quantizer 106 is the output from the noise-shaping filter 104 after passing through an inverter 112. The inverted value is then input into the quantizer 108. Like the quantizer 106, the second input is the ramp wave 110. As mentioned previously, alternative embodiments may use a single polarity for the filter output and instead invert the ramp signal for the quantizer 108.

Figure 3:
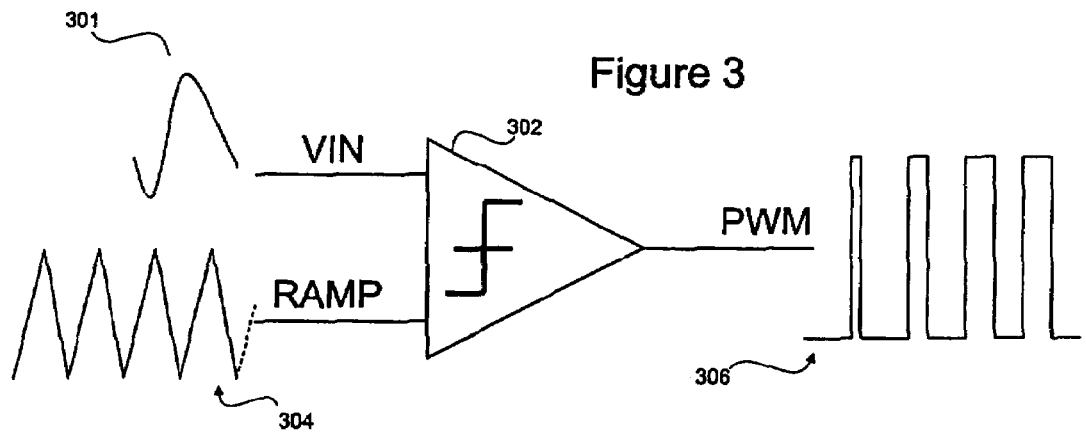
FIG. 3 is a diagram of one embodiment of natural sampling.
Figure 4:
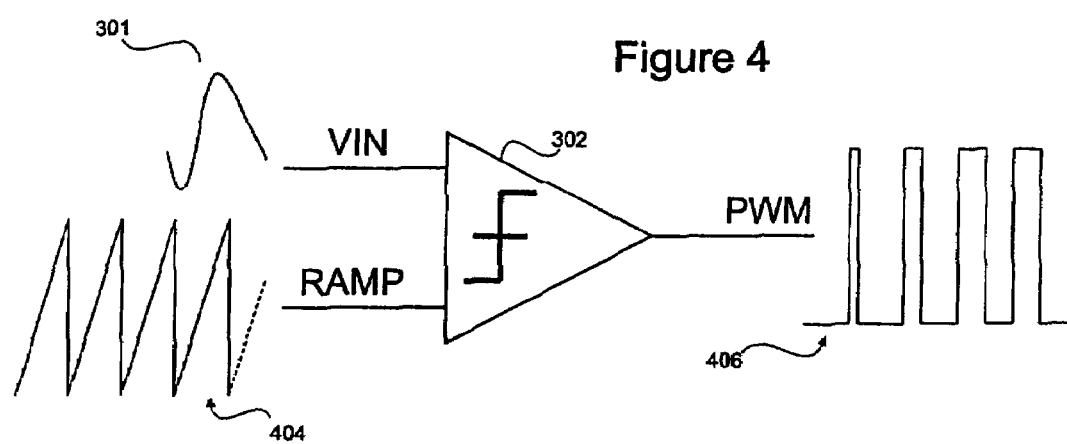
FIG. 4 is a diagram of an alternate embodiment of natural sampling.

FIGS. 3 and 4 are embodiments with a quantizer receiving an input and a ramp wave and outputting a PWM output signal. FIG. 3 is a diagram of one embodiment of natural sampling with quantizer 302. Natural sampling includes converting a signal that is continuous in time and amplitude into a signal that is still continuous in time, but discrete in its amplitude level. The quantizer 302 receives an input value, such as a voltage input Vin 301 and receives a ramp wave 304 and outputs a pulse width modulated ("PWM") signal 306. In one embodiment, the quantizer 302 may be either the quantizer 106 or the quantizer 108 as shown in the modulator 100. The type of ramp wave 304 may influence the resulting PWM signal 306. As shown, PWM signal 306 may have an amplitude that is at one of two levels. In the ideal case the resulting PWM signal 306 contains no distortion products between the input signal frequency and half the ramp frequency. As a result, the PWM signal 306 may be a distortionless representation of the input signal Vin 301.

Referring to FIG. 4, the quantizer 302 is shown with a voltage input Vin 301 as in FIG. 3. However, the ramp wave 404 is different from the ramp wave 304 in FIG. 3. The ramp wave 304 was a triangle wave form and the ramp wave 404 is a sawtooth wave form. The triangular ramp wave 304 linearly goes up from minus full-scale to plus full-scale and then goes back linearly as well. Conversely, the sawtooth ramp wave 404 is reset from positive full-scale back to negative full-scale and then linearly goes up, at which point it is reset back to negative full-scale. As a result the PWM output signal 406 is different. In particular, the resulting PWM waveform of FIG. 3 carries information in both the upward and downward transitions since both transitions may be modulated relative to the ramp phase. On the other hand, the PWM waveform of FIG. 4 carries information only on the downward transition since the upward transition is synchronized with the ramp phase. The impact of this difference may not be significant in the ideal case when the transitions are free to occur at any point in time. However, when the PWM waveform is synchronized to a high speed clock, the signal of FIG. 3 will exhibit greater fidelity as compared to the PWM waveform of FIG. 4 for a given ramp frequency because of the added information contained in the waveform of FIG. 3.

The respective output pulse width of the PWM signals 306, 406 may be wide or narrow. The width is referred to as the duty ratio the PWM. In one embodiment, near maximum power output may be achieved because the range of duty ratios that may be reliably produced in the PWM format can be very close to 0 and 100%. Accordingly, the signaling format is very efficient and similar to non-return-to-zero ("NRZ") feedback formats used in more traditional sigma-delta modulators. However, in traditional sigma-delta modulators, NRZ feedback may not used because of the non-linearities due to intersymbol interference inherent in this data format. Thus, return-to-zero ("RZ") format may be used, such that the feedback signal is made to transition from zero to +1 or −1 and back to 0 during the switching cycle. The linearity advantages in this case stem from the fact that two transitions occur during every switching cycle independent of the ADC input signal, and therefore no signal dependent distortion is produced. Unfortunately, the RZ format results in a reduction in feedback power available in the system and thus limits the ADC input power that can be accommodated. The PWM format retains the linearity advantages of the RZ format because it shares the characteristic of possessing two transitions per switching cycle independent of the ADC input signal. Accordingly, the PWM format may bring the advantages of both the NRZ and RZ formats while avoiding the limitations.

As shown in FIGS. 3 and 4, the output PWM signals 306, 406 may be continuous in time through transitions between two discrete amplitude levels. Likewise, referring back to FIG. 1, the quantizers 106, 108 output a signal that is continuous in time. However, the flip-flop 114, and the flip-flop 116 are both synchronized to a quantization clock signal QCLK. The transition of the PWM signals are adjusted to coincide with the QCLK, which results in quantization noise and other distortion products. However, the overall loop shapes this distortion and quantization noise out of the bandwidth of interest and moves it into a frequency bandwidth that is filtered by downstream digital filters (not shown).

Accordingly, the outputs of the quantizers 106, 108 are input into the flip-flops 114, 116, respectively. As shown, the flip-flops are d-type flip-flops. The flip-flops 114, 116 receive a clock signal QCLK. The flip-flops may synchronize the PWM signal to a defined high speed clock for the sake of downstream digital processing. In other embodiments, the flip-flops may be an integral part of the quantizer or comparator.

The output from the flip-flop 114 is the output signal PWM+ and the output from the flip-flop 116 is the output signal PWM−. The output signals PWM+ and PWM− are fed back to the summer 102 as dual feedback signals. As a result of the feedback inputs PWM+ and PWM− that are input back into the summer 102, the bandwidth and dynamic range required from the noise-shaping filter 104 may be reduced. In other words, without the dual feedback loops in some embodiments, the noise-shaping filter 104 needed to contain a certain amount of headroom or bandwidth to accommodate the signal that would be transmitted from a single PWM signal may be large. For example, when no signal is applied to an ADC with only one PWM feedback signal, the feedback signal would be a simple square wave, i.e. a PWM signal with 50% duty ratio, with an amplitude corresponding roughly to the maximum expected ADC input signal amplitude. The noise-shaping filter would need to be designed to accommodate this large square wave or carrier signal. The combination of the two feedback PWM signals reduces the signal range that the noise-shaping filter 104 must accommodate. This is particularly evident under low input signal power. For example, if there is a zero input signal Vin, then the resulting feedback signals PWM+ and PWM− cancel one another at the summer. In other words, the carrier signal is suppressed. In particular, the quantizers 106, 108 transition at substantially the same time, but in opposite directions, so when the resulting feedback signals PWM+ and PWM− are summed back together in the summer 102, they cancel. Therefore, under zero-input signal conditions, the signal amplitude swings within the filter may be very small or zero.

On the other hand, if the input signal Vin is large, then the feedback signals PWM+ and PWM− function to cancel or reduce the input signal Vin, so that the signal energy input into the noise-shaping filter 104 is reduced. Accordingly, power dissipation may be reduced in the noise-shaping filter 104 by reducing the need to accommodate a larger bandwidth and or signal range. For a large input signal Vin, the transitions in the PWM+ and the PWM− signals occur at different points in time in the complementary PWM format embodiments. Accordingly, the upward transition of the PWM− signal may not coincide with the downward transition of the PWM+ signal, and vice-versa. Accordingly, less time passes on the average between updates to the feedback signal. This is essentially an effective increase in the sampling rate of the system. This increase in the effective sampling rate improves the stability of the sigma-delta modulator system by reducing the time between updates to the feedback signal.

As described above, the modulator 100 may be a sigma delta modulator. Sigma-delta modulation may involve making an estimation of a signal, measuring the error between the signal and a feedback signal, integrating the error, and compensating for the error by updating the feedback signal. Accordingly, the output signal approximates the input signal with an error that is reduced in band through the action of the loop filter. Sigma delta modulation utilizes oversampling to reduce the quantization noise in the band of interest by oversampling the desired signal by a large factor and filtering the resulting digital signal. Oversampling may refer to the generation of an output sample at a greater frequency than the frequency of the input. In one embodiment, a sigma delta modulator may be utilized with complementary metal oxide semiconductor ("CMOS") processes.

As described herein, an ADC with a suppressed carrier PWM signal may be used in a variety of electrical devices. In one embodiment, the ADC may be used in an integrated circuit manufactured with a sub-micron CMOS process for use in WCDMA and GSM cellular transceiver ICs as well as in Digital Video Broadcast ("DVB") receivers. In particular, the circuit may be used in 3G and other wideband wireless receivers. In alternative embodiments, the circuit may be manufactured with another CMOS process.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter is to be considered illustrative, and not restrictive or limiting, and the appended claims are intended to cover all such modifications, enhancements, and other embodiments, which fall within the true spirit and scope of the present invention. Thus, to the maximum extent allowed by law, the spirit and scope of the present invention is to be determined by the broadest permissible interpretation of the following claims, including all equivalents, and shall not be restricted or limited by the foregoing detailed description.

To clarify the use in the pending claims and to hereby provide notice to the public, the phrases "at least one of <A>, <B>, . . . and <N>" or "at least one of <A>, <B>, . . . <N>, or combinations thereof" are defined by the Applicant in the broadest sense, superseding any other implied definitions hereinbefore or hereinafter unless expressly asserted by the Applicant to the contrary, to mean one or more elements selected from the group comprising A, B, . . . and N, that is to say, any combination of one or more of the elements A, B, . . . or N including any one element alone or in combination with one or more of the other elements which may also include, in combination, additional elements not listed.

The embodiments described herein include a system and method for converting an analog signal to a digital signal with dual feedback signals. The embodiments relate to a suppressed carrier pulse width modulated ("PWM") quantizer in a sigma delta modulator.

In a first aspect, a system for performing analog-to-digital conversion ("ADC") with a pulse width modulated ("PWM") feedback signal includes a summer receiving an input signal. A noise shaping filter is coupled with the summer and configured to receive and filter the output signal of the summer. A first quantizer is coupled with the noise shaping filter and configured to receive the filtered signal and generate a first PWM signal. A second quantizer is coupled with the noise shaping filter and configured to receive the filtered signal and generate a second PWM signal. The first PWM signal and the second PWM signal are then fed back to the summer.

In a second aspect, an analog-to-digital converter includes a summer configured to receive an input signal and at least one feedback signal and generate an error signal. At least one quantizer is configured to receive the error signal and generate pulse width modulated ("PWM") feedback signals based on the error signal, wherein at least one of the PWM feedback signals is fed back into the summer as the at least one feedback signal.

In a third aspect, a method for converting an analog input signal to a digital output signal includes receiving an input signal. Feedback signals are generated based on the input signal with at least one quantizer. The feedback signals are combined with the filtered input signal to adjust the signal.

In a fourth aspect, a method for generating a suppressed carrier feedback signal in a sigma delta modulator includes receiving and quantizing an input signal. A plurality of pulse width modulated ("PWM") signals are generated and combined with the input signal to generate a new input signal.

The present invention is defined by the following claims and the equivalents, and nothing in this section should be taken as a limitation on those claims. Further aspects and advantages of the invention are discussed below in conjunction with the embodiments.

The invention claimed is:

1. A system for performing analog-to-digital conversion ("ADC") with a pulse width modulated ("PWM") feedback signal comprising:
   a summer receiving an input signal, at least one feedback signal and generating an output error signal;
   a noise shaping filter coupled with the summer and configured to receive and filter the error signal;
   a first quantizer coupled with the noise shaping filter and configured to receive the filtered error signal and generate a first PWM signal;
   an inverter coupled with the noise shaping filter and configured to invert the filtered error signal; and
   a second quantizer coupled with the inverter and configured to receive the inverted filtered error signal and generate a second PWM signal;
   wherein the first PWM signal and the second PWM signal are fed back into the summer.

2. The system according to claim 1 wherein a duty ratio of the first PWM signal is complementary of a duty ration of the second PWM signal.

3. The system according to claim 1 further comprising:
   a ramp wave input coupled with the first quantizer and the second quantizer;
   wherein the ramp wave input includes a ramp wave signal that is input into the first quantizer and the second quantizer.

4. The system according to claim 1 further comprising:
   a first flip-flop coupled with the first quantizer; and
   a second flip-flop coupled with the second quantizer;
   wherein the first flip-flop is configured to receive an output from the first quantizer and generate the first PWM signal, further wherein the second flip-flop is configured to receive an output from the second quantizer and generate the second PWM signal.

5. The system according to claim 4 wherein the first flip-flop and the second flip-flop are coupled with a quantization clock, and wherein the first flip-flop and the second flip-flop are d-q flip-flops.

6. The system according to claim 1 wherein the noise shaping filter is a third order transconductor-capacitor ("Gm-C") filter.

7. The system according to claim 1 wherein the first PWM signal is complementary of the second PWM signal and a carrier energy of the first PWM signal substantially cancels a carrier energy of the second PWM signal in the summer.

8. The system according to claim 1 wherein the ADC is a sigma delta modulator.

9. An analog-to-digital converter comprising:
   a summer configured to receive an input signal and at least one feedback signal and generate an error signal;
   a plurality of quantizers each configured to receive the error signal and generate a pulse width modulated ("PWM") feedback signals based on the error signal, wherein the PWM feedback signals are fed back into the summer as the at least one feedback signal; and
   an inverter coupled with one of the plurality of quantizers and configured to invert the error signal inputted into that quantizer.

10. The converter according to claim 9 wherein the plurality of quantizers includes a first quantizer and a second quantizer, wherein the first quantizer generates a first PWM feedback signal and the second quantizer generates a second PWM feedback signal.

11. The converter according to claim 10 further comprising a first and second flip-flop coupled with the first and second quantizer respectively.

12. The converter according to claim 9 further comprising a summer coupled with the at least one quantizer and configured to generate the input signal.

13. The converter according to claim 9 wherein the PWM feedback signals include a first PWM signal outputted from a first quantizer and a second PWM signal outputted from a second quantizer, further wherein the first PWM feedback signal is complementary of the second PWM feedback signal and a carrier energy of the first PWM signal effectively cancels a carrier energy of the second PWM signal.

14. The converter according to claim 13 further comprising:
   a filter coupled with at least one of the quantizers and configured to generate the input signal;
   wherein the inverter is coupled with the filter and the filtered signal is inverted by the inverter before being input into the second quantizer.

15. The converter according to claim 9 further comprising:
   a ramp wave input coupled with the at least one quantizer;
   wherein the ramp wave input includes a ramp wave signal that is input into the at least one quantizer.

16. A method for converting an analog input signal to a digital output signal comprising:
   receiving an input signal;
   summing the input signal with feedback signals to generate an error signal;
   generating the feedback signals based on the error signal with at least one quantizer;
   inverting one of the feedback signals; and
   combining the feedback signals including the inverted feedback signal with the input signal to adjust the error signal.

17. The method according to claim 16, wherein the feedback signals are pulse width modulated and at least one of the feedback signals is the digital output signal.

18. The method according to claim 16 wherein each of the feedback signals are further generated by at least one flip-flop.

19. The method according to claim 16 further comprising:
   quantizing the error signal;
   generating a plurality of pulse width modulated ("PWM") signals; and
   feeding the plurality of PWM signals back to the input signal to be summed as the feedback signals.

20. The method according to claim 19 wherein the PWM signals are complementary.

* * * * *

UNITED STATES PATENT AND TRADEMARK OFFICE
CERTIFICATE OF CORRECTION

PATENT NO. : 7,352,311 B2 Page 1 of 1
APPLICATION NO. : 11/507919
DATED : August 22, 2006
INVENTOR(S) : Matthew R Miller It is certified that error appears in the above-identified patent and that said Letters Patent is hereby corrected as shown below:

In Column 9, Line 59, Claim No. 9:
Change "("PWM") feedback signals based on the error signal," to --("PWM") feedback signal based on the error signal,--

Signed and Sealed this

Twenty-fourth Day of June, 2008

JON W. DUDAS
*Director of the United States Patent and Trademark Office*

UNITED STATES PATENT AND TRADEMARK OFFICE
CERTIFICATE OF CORRECTION

PATENT NO. : 7,352,311 B2 Page 1 of 1
APPLICATION NO. : 11/507919
DATED : April 1, 2008
INVENTOR(S) : Matthew R Miller It is certified that error appears in the above-identified patent and that said Letters Patent is hereby corrected as shown below:

In Column 9, Line 59, Claim No. 9:
Change "("PWM") feedback signals based on the error signal," to --("PWM") feedback signal based on the error signal,--

This certificate supersedes the Certificate of Correction issued June 24, 2008.

Signed and Sealed this

Twenty-second Day of July, 2008

JON W. DUDAS
*Director of the United States Patent and Trademark Office*